(12) United States Patent
Gassauer

(10) Patent No.: US 8,512,068 B2
(45) Date of Patent: Aug. 20, 2013

(54) CONDUCTOR INSERTION PLUG

(75) Inventor: Stephan Gassauer, Ilfeld (DE)

(73) Assignee: WAGO Verwaltungsgesellschaft mbH, Minden (DE)

( * ) Notice: Subject to any disclaimer, the term of this patent is extended or adjusted under 35 U.S.C. 154(b) by 103 days.

(21) Appl. No.: 13/052,396

(22) Filed: Mar. 21, 2011

(65) Prior Publication Data
US 2011/0237113 A1   Sep. 29, 2011

(30) Foreign Application Priority Data
Mar. 25, 2010   (DE) .......................... 10 2010 012 820

(51) Int. Cl.
*H01R 11/20*   (2006.01)

(52) U.S. Cl.
USPC ............................. 439/411; 439/828; 439/886

(58) Field of Classification Search
USPC ................................... 439/828, 441, 886, 834
See application file for complete search history.

(56) References Cited

U.S. PATENT DOCUMENTS

| | | | |
|---|---|---|---|
| 6,911,602 B2 * | 6/2005 | Conrad | 174/68.2 |
| 7,232,324 B2 * | 6/2007 | Oesterhaus | 439/268 |
| 8,133,082 B2 * | 3/2012 | Ludwig | 439/886 |
| 8,142,906 B2 * | 3/2012 | Taira et al. | 428/647 |
| 8,251,738 B2 * | 8/2012 | Heckert et al. | 439/441 |
| 2001/0008709 A1 * | 7/2001 | Asakura et al. | 428/647 |
| 2005/0048308 A1 * | 3/2005 | Mucklich et al. | 428/614 |
| 2006/0175203 A1 * | 8/2006 | Davis et al. | 205/170 |
| 2010/0190390 A1 * | 7/2010 | Yoshida et al. | 439/886 |

* cited by examiner

*Primary Examiner* — Hien Vu
(74) *Attorney, Agent, or Firm* — Renner, Otto, Boiselle & Sklar, LLP

(57) ABSTRACT

Conductor insertion plug (1) having a grip section (2) and at least one conductive plug section (3) for insertion into a conductor insertion opening (25) in a spring force terminal (20) which has an insulating material housing (21) with at least one busbar (22) inserted therein and at least one clamping spring (23), with the clamping spring (23) having a clamping edge (24) which is oriented at an acute angle in relation to an electrical conductor which is inserted into the conductor insertion opening (25) and, together with an opposite section of the busbar (22), forms a clamping point for the electrical conductor, with the plug section (3) which is located outside the grip section (2) being formed, at least in a contact region which is intended to make contact with the clamping spring (23), with at least two layers comprising a first layer (4) which faces the clamping spring (23) and is composed of a first metal material and a second layer (5) which faces the busbar (22) and is composed of a second metal material.

12 Claims, 5 Drawing Sheets

CONDUCTOR INSERTION PLUG

The invention relates to a conductor insertion plug having a grip section and at least one conductive plug section for insertion into a conductor insertion opening in a spring force terminal which has an insulating material housing with at least one busbar inserted therein and at least one clamping spring, with the clamping spring having a clamping edge which is oriented at an acute angle in relation to an electrical conductor which is inserted into the conductor insertion opening and, together with an opposite section of the busbar, forms a clamping point for the electrical conductor.

PRIOR ART

DE 10 2008 055 776.5 (not yet published) describes a conductor insertion plug which can be inserted into a conductor insertion opening in a spring force terminal and which is held in a clamped manner in the clamping position of the spring force connection by a clamping spring. To this end, the tip of the conductor insertion plug is shaped in such a way that it latches behind an edge of a busbar. Furthermore, the tip of the conductor insertion plug is rounded in relation to the clamping limb of the clamping spring, and therefore the clamping edge of the clamping limb cannot come into interengaging contact with the conductor insertion plug and the conductor insertion plug can be easily removed again. One disadvantage of this is that the conductor insertion plug has to be matched to the clamping spring force connection and therefore cannot be used universally.

Furthermore, DE 200 02 713 U1 discloses a conductor insertion plug for a spring force terminal which is inserted into an opening for an operating tool. The conductor insertion plug is designed in a complex manner as a multi-layer folded stamped and bent part, with the contact webs which are folded in relation to one another and lie one on the other being designed such that they can pivot in relation to one another. Since the conductor insertion plug makes contact only with the clamping spring which is produced from a relatively poorly conductive material, poor electrical values are also produced.

OBJECT OF THE INVENTION

The object of the invention is to further develop a conductor insertion plug to the effect that it has, with the lowest possible operating forces, a broader range of use compared to the prior art and at the same time has the simplest and most compact structure possible.

DISCLOSURE OF THE INVENTION

The object is achieved with a conductor insertion plug of the kind cited in the introductory part in that, according to the invention, the plug section which is located outside the grip section is formed, at least in a contact region which is intended to make contact with the clamping spring, with at least two layers comprising a first layer which faces the clamping spring and is composed of a first metal material, and a second layer which faces the busbar and is composed of a second metal material.

The design according to the invention makes it possible for a conductor insertion plug which is inserted into the conductor insertion opening to not be able to interengage with the clamping spring and accordingly to be able to be removed again with low operating forces. It is particularly advantageous here for that layer of the plug section which faces the clamping spring to consist of a steel alloy which is harder than or at least as hard as the clamping spring. As a result, the lowest possible tensile forces for removing the conductor insertion plug are ensured since the clamping edge of the clamping spring cannot interengage with the surface of the conductor insertion plug facing it and merely slides over the surface. At the same time, the plugging forces of the conductor insertion plug do not exceed the plugging forces for an electrical conductor and therefore there is no loss of convenience in this respect. In order to ensure as good a flow of current as possible from the busbar to the conductor insertion plug, that layer of the plug section which faces the busbar is in this case advantageously produced from a highly electrically conductive material, for example from copper or a copper alloy. This material of the second layer should, in this case, have a higher electrical conductivity than the material of the first layer which faces the clamping spring. In order to avoid an oxide layer which has negative influence on the electrical properties, the material of the second metal layer can be provided with a surface layer, for example a tin plating. As a result, the sliding properties of the second layer in relation to the busbar can also be improved.

In an advantageous embodiment of the invention, the at least two different layers of the plug section are firmly connected to one another, in order to be firmly fixed to one another, in a cohesive manner, for example by way of a friction or spot weld, or by an adhesive bonding connection or an interlocking connection, for example a dovetail-like connection. As an alternative, the two layers can also be connected to one another by a common injection mold during the injection-molding process of the grip section.

The plug section is particularly advantageously substantially linear and/or has a substantially rectangular cross section over its section which can be inserted into the spring force terminal. As a result, the design of the plug section of the conductor insertion plug is kept particularly simple and compact and therefore also cost-effective.

The grip section of the conductor insertion plug can preferably have a coding lug which extends in the direction of the plug section and adjacent to the plug section and which is adapted in order to enter an operating opening which is arranged next to the conductor insertion opening in the insulating material housing of the spring force terminal. In this way, the operating opening, which is usually arranged next to the conductor insertion opening in the insulating material housing of the spring force terminal, is used to ensure the correct orientation of the conductor insertion plug, the conductor insertion plug being secured by clamping force on the busbar with the said orientation. This orientation is achieved when the coding lug enters the operating opening. Otherwise, contact is not made or is not correctly made with the busbar by the plug section and the plug section is clamped by the clamping spring.

In a further preferred embodiment (see FIG. 5), the conductor insertion plug can be in the form of a bridge with at least two plug sections which are arranged next to one another and extend in parallel in the same direction and are electrically conductively connected to one another. In this way, the bridge can be firmly clamped to the busbar and nevertheless be easily withdrawn again.

However, the conductor insertion plug can also be in the form of a test plug with a test connection, which is electrically conductively connected to the plug section and is in the form of a female part for example, in the grip section. As an alternative or else in addition, the plug section of the conductor insertion plug can be electrically conductively connected to a conductor connection apparatus, for example a spring terminal or a screw terminal, in the grip section in order to be able to clamp an electrical conductor.

BRIEF DESCRIPTION OF THE DRAWINGS

The invention will be explained in greater detail below with reference to an exemplary embodiment which is illustrated in the figures, in which

FIG. 5: is a pair of the conductor insertion plug illustrated by FIG. 1a.

EMBODIMENT OF THE INVENTION

Figure 1A:
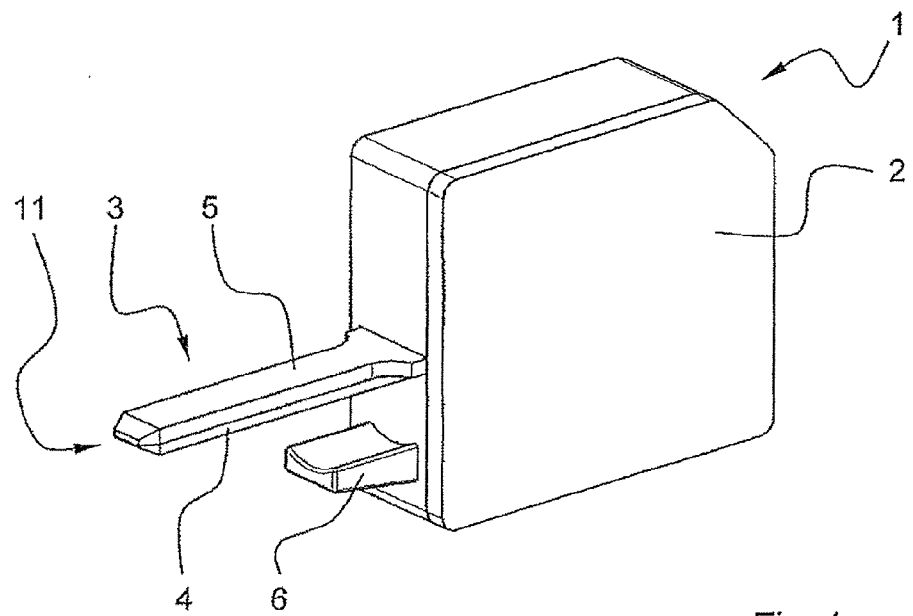
FIG. 1a: is a first three-dimensional illustration of a conductor insertion plug according to the invention.
Figure 1B:
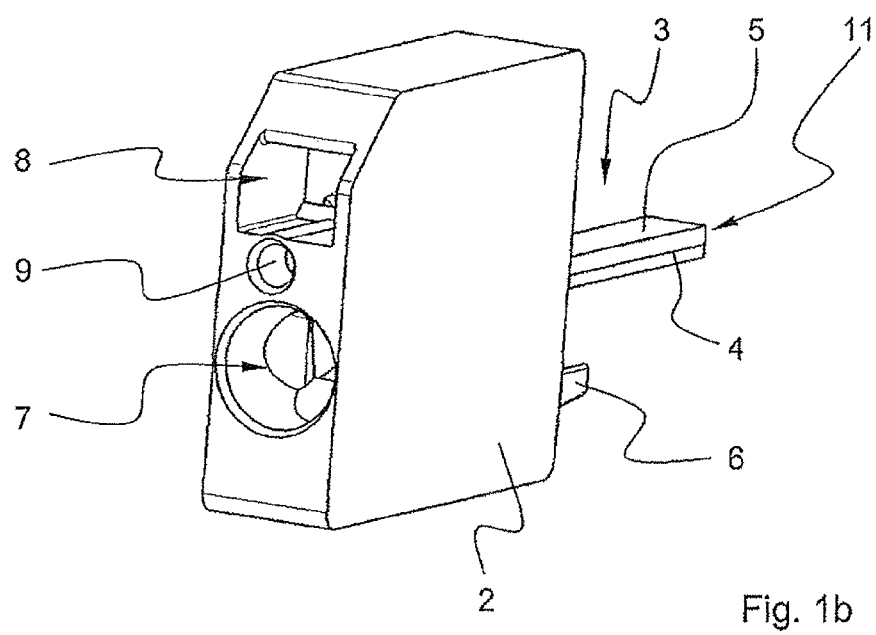
FIG. 1b: is a second three-dimensional illustration of a conductor insertion plug according to the invention.
Figure 2:
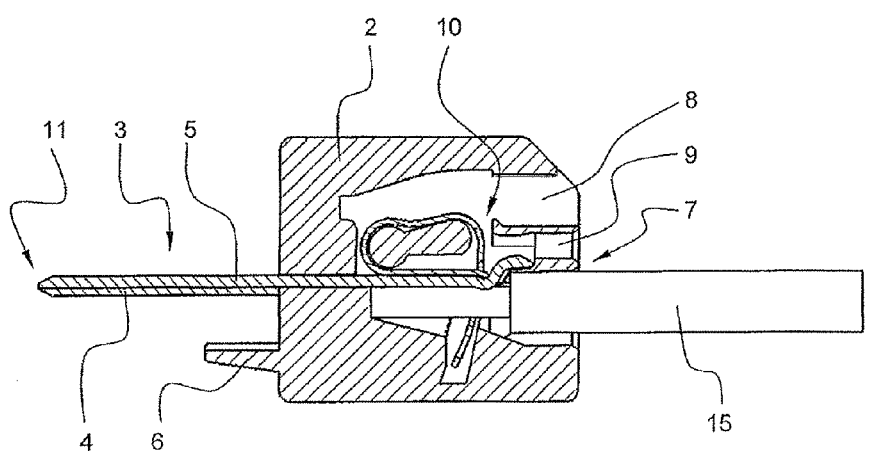
FIG. 2: is a sectional illustration of a conductor insertion plug according to the invention with an electrical conductor inserted.

FIGS. 1a, 1b and 2 show an exemplary embodiment of a conductor insertion plug 1, with the conductor insertion plug 1 having a grip section 2 and a plug section 3. The plug section 3 has a first layer 4 which consists of a metal and a second metal layer 5 which preferably consists of copper or a copper alloy, with the second metal layer 5 extending into the insulating material housing 21 of the grip section 2 and there interacting in a known manner with a clamping spring 10 which, in this example, is in the form of a cage tension spring, in order to accommodate, in a clamped manner, an electrical conductor 15 (illustrated by way of example) which is inserted into a conductor insertion opening 7 in the grip section 2. Furthermore, the grip section 2 has an operating opening 8 for inserting a release tool (not illustrated) and a test opening 9 for inserting a test pin (likewise not illustrated). The internal design of the grip section 2 is merely exemplary, and therefore the grip section 2 of the conductor insertion plug 1 can also have only a test opening 9 for test purposes. Furthermore, a coding lug 6 for correctly orienting the conductor insertion plug 1 during the plugging process is formed on the grip section 2. In this case, it is also possible to provide a plurality of coding lugs 6 on the grip section 2, should this be required on account of the contours at the adjoining mating piece.

The first metal layer 4 of the plug section 3, which layer is located outside the grip section 2, is produced, for example, from a CrNi steel alloy. The connection between the first metal layer 4 and the second metal layer 5 can be established in various ways. For example, in addition to an adhesive bonding connection, a cohesive connection which is established by, for example, friction or spot welding can also be implemented. An interlocking connection, for example in the form of a dovetail connection, is also feasible. In addition, a plating or coating process is also possible.

Figure 3:
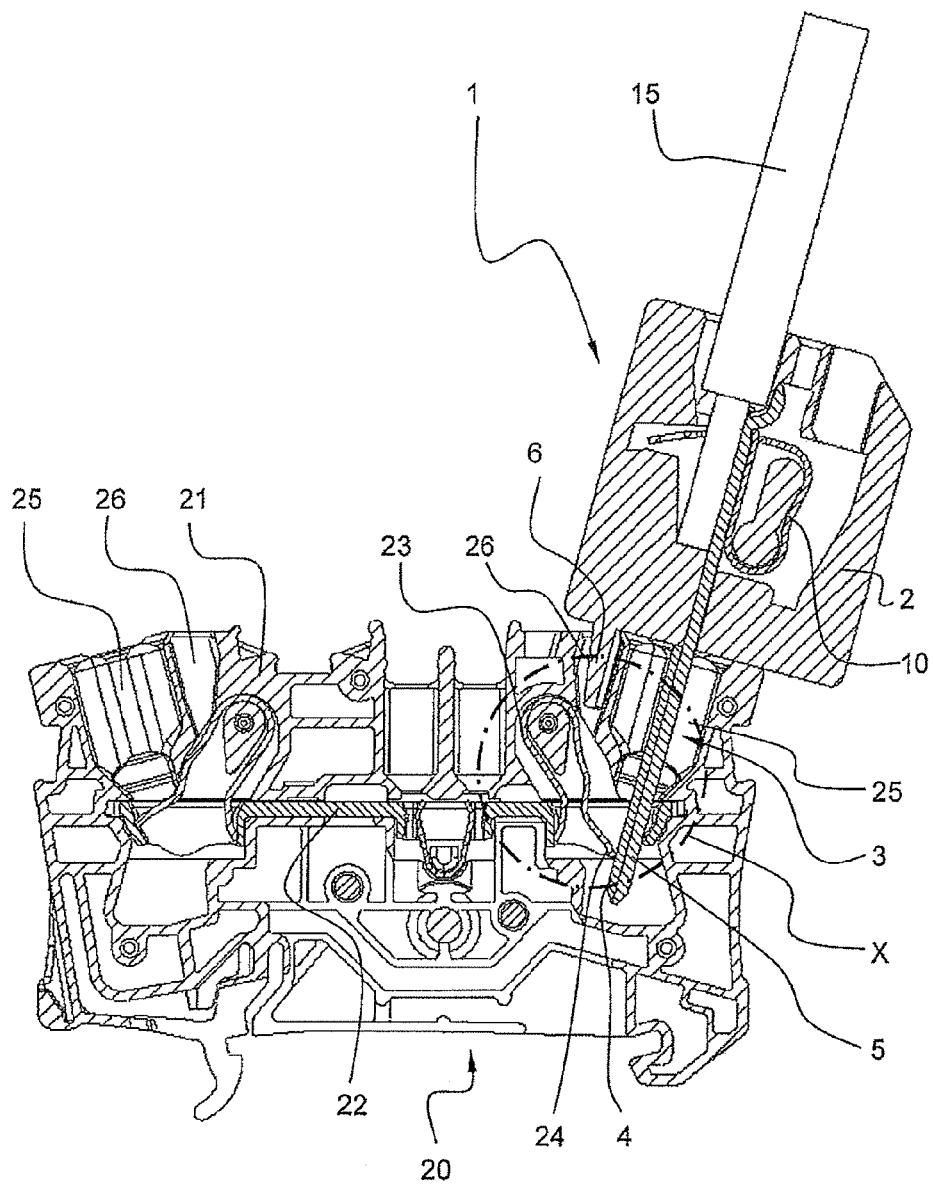
FIG. 3: is a sectional illustration of a spring force terminal with a conductor insertion plug according to the invention inserted.

FIG. 3 shows a spring force terminal 20, in particular a terminal block, having a conductor insertion plug 1 according to the invention which is inserted into a conductor insertion opening 25 in the spring force terminal 20. In this case, the conductor insertion plug 1 bears against the insulating material housing 21 of the spring force terminal 20, with the coding lug 6 of the grip section entering an operating opening 26 in the spring force terminal 20. A busbar 22 is arranged within the spring force terminal 20, with the busbar having an opening 27 (FIG. 4) within which a clamping spring 23 is inserted. In this case, the clamping spring 23 is substantially in the shape of a U with a retaining limb, which is fitted in the opening 27, and a clamping limb which is connected by means of a spring bow, with the clamping limb having a clamping edge 24 at its outer end.

Figure 4:
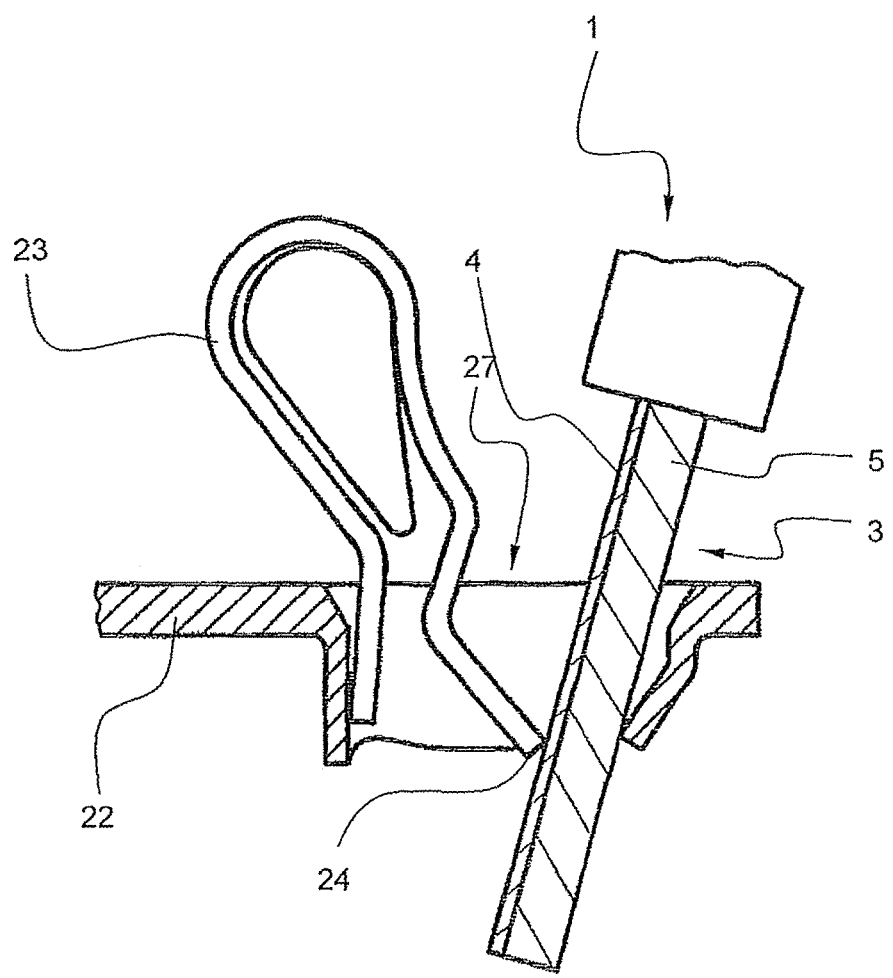
FIG. 4: is an enlarged illustration of a detail X according to FIG. 3 of the conductor insertion plug according to the invention inserted into the clamping point.
Figure 5:
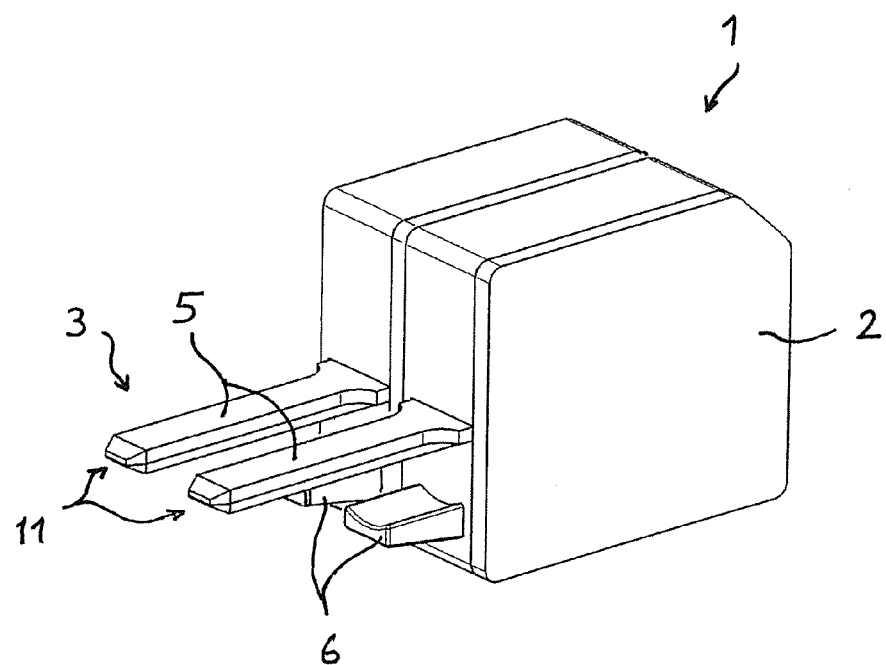

With reference to FIG. 3 and FIG. 4, the clamping edge 24 is directed towards the first metal layer 4 of the plug section 3, which layer consists of a steel alloy, whereas the second metal layer 5, which consists of a copper material, bears against the busbar 22. Since the first metal layer 4 consists of a steel material which is approximately as hard or harder than the material of the clamping spring 23, the clamping edge 29 cannot interengage in the surface of the first metal layer 4. The conductor insertion plug 1 can therefore be removed again from the spring force terminal 20 counter to the insertion direction with a low outlay of force since only the spring force of the spring terminal 23 acts on the conductor insertion plug 1 and there are no reinforcing effects due to interengagement of the clamping edge in the plug section 3. The second metal layer 5 is, in contrast, produced from a highly conductive material such as copper or a copper alloy in order to ensure good flow of current from the busbar to the current tap in the grip section. Since the busbar 22 consists of a similar material, in particular a material which is approximately as hard as the second metal layer 5, no interengagement of a busbar edge in relation to the surface of the second metal layer 5 can occur here either, and therefore no additional forces need to be overcome on this side when removing the conductor insertion plug from the spring force terminal 20. The second metal layer 5 can additionally be coated, for example with tin, particularly for improving the sliding properties of the second metal layer 5 relative to the busbar 22.

In the figures shown here, the first metal layer 4 is illustrated outside the grip section over the entire extent of the plug section 3. However, as an alternative, the first metal layer 4 can also project into the grip section 2, and therefore the first metal layer 4 and the second metal layer 5 are jointly surrounded and/or extrusion coated by the insulating material of the grip section 2. Furthermore, the first metal layer 4 can also be provided, starting from the tip 11 of the plug section 3, in only one subregion of the plug section 3 which is located outside the grip section 2. In this case it is critical that, at the maximum insertion depth of the conductor insertion plug 1 into a spring force terminal 20, the clamping edge 24 of the clamping spring 23 remains in contact with the first metal layer 4 which consists of the steel alloy, so that the conductor insertion plug 1 can still be removed again with low operating forces. Furthermore, the width of the first metal layer 4 and the width of the second metal layer 5 can also be different, in each case as seen perpendicular to the longitudinal extent of the plug section 3 and in the direction of the clamping edge 24.

The conductor insertion plug shown here can therefore be used largely universally since it can be designed largely independently of a required insertion depth and can also be used for different spring force terminals and different clamping springs or force spring connections.

LIST OF REFERENCE SYMBOLS

1 Conductor insertion plug
2 Grip section
3 Plug section
4 First layer

5 Second layer
6 Coding lug
7 Conductor insertion opening
8 Operating opening
9 Test opening
10 Clamping spring
11 Tip of the plug section
15 Electrical conductor
20 Spring force terminal, terminal block
21 Insulating material housing
22 Busbar
23 Clamping spring
24 Clamping edge
25 Conductor insertion opening
26 Operating opening
27 Opening

The invention claimed is:

1. A conductor insertion plug comprising:
   a grip section having an opening for receiving a conductor cable; and
   at least one conductive plug section provided for connection with the condor cable for insertion into a conductor insertion opening in a spring force terminal,
   wherein the spring force terminal has an insulating material housing with at least one busbar inserted therein and at least one clamping spring,
   wherein the at least one clamping spring has a clamping edge which is oriented at an acute angle in relation to an electrical conductor which is inserted into the conductor insertion opening and, together with an opposite section of the busbar, forms a clamping point for the electrical conductor, and
   wherein the at least one conductive plug section which is located outside the grip section is formed, at least in a contact region which is intended to make contact with the clamping spring, with at least two layers comprising a first layer which faces the clamping spring and is composed of a first metal material and a second layer which faces the busbar and is composed of a second metal material, and
   wherein the first layer is harder than the second layer, and the second layer has a higher electrical conductivity than the first layer.

2. The conductor insertion plug according to claim 1, wherein the first layer of the plug section, which layer faces the clamping spring, consists of a steel alloy which is harder than or at least approximately as hard as the clamping spring.

3. The conductor insertion plug according to claim 1, wherein the second layer is copper or a copper alloy.

4. The conductor insertion plug according to claim 1, wherein the second layer has a surface coating.

5. The conductor insertion plug according to claim 4, wherein the surface coating is (5) tin or a tin alloy.

6. The conductor insertion plug according to claim 1, wherein the first layer and the second layer are firmly connected to one another by means of a cohesive connection or an adhesive bond or an interlocking connection.

7. The conductor insertion plug according to claim 1, wherein the plug section is substantially linear and/or has a substantially rectangular cross section over its section which can be inserted into the spring force terminal.

8. The conductor insertion plug according to claim 1, wherein the grip section of the conductor insertion plug has a coding device for an insertion process in the correct position.

9. The conductor insertion plug according to claim 8, wherein the grip section of the conductor insertion plug has a coding lug which extends in the direction of the plug section and adjacent to the plug section and which is adapted in order to enter an operating opening which is arranged next to the conductor insertion opening in the insulating material housing of the spring force terminal.

10. The conductor insertion plug according to claim 1, wherein the conductor insertion plug is in the form of a bridge with at least two plug sections which are arranged next to one another and extend in parallel in the same direction and are electrically conductively connected to one another.

11. The conductor insertion plug according to claim 1 further comprising:
    a test connection which is electrically conductively connected to the plug section for connection of an electrical conductor.

12. The conductor insertion plug according to claim 3, wherein the second layer has a surface coating.

* * * * *